United States Patent [19]

Gupta

[11] Patent Number: 4,997,809
[45] Date of Patent: Mar. 5, 1991

[54] FABRICATION OF PATTERNED LINES OF HIGH $T_c$ SUPERCONDUCTORS

[75] Inventor: Arunava Gupta, Valley Cottage, N.Y.

[73] Assignee: International Business Machines Corporation, Armonk, N.Y.

[21] Appl. No.: 121,982

[22] Filed: Nov. 18, 1987

[51] Int. Cl.$^5$ .......................... B05D 5/12; B05D 3/02; B05D 3/06
[52] U.S. Cl. ......................................... 505/1; 505/737; 505/742; 427/43.1; 427/53.1; 427/62; 427/63; 427/226; 427/314
[58] Field of Search ..................... 427/43.1, 53.1, 226, 427/314, 62, 63; 505/1, 737, 742, 741

[56] References Cited

U.S. PATENT DOCUMENTS 3,801,366  4/1974  Lemelson ........................... 427/43.1
4,395,436  7/1983  Bianchi et al. ..................... 427/53.1

OTHER PUBLICATIONS

Kawai et al., *Jap. J. of App. Phys.*, vol. 26, No. 10, Oct. 1987, pp. L1740-L1742.

Primary Examiner—Norman Morgenstern
Assistant Examiner—Margaret Bueker
Attorney, Agent, or Firm—Jackson E. Stanland; J. David Ellett, Jr.

[57] ABSTRACT

A method for producing a patterned layer of high $T_c$ oxide superconductor is provided in which patterning is accomplished prior to the attainment of a superconducting state in the layer. A solution containing precursor components of the desired oxide superconductor is sprayed onto a substrate and dried to provide a layer thereon. This layer is then irradiated in selected areas to convert the irradiated layers to an intermediate oxide state, the nonirradiated areas being unchanged. The nonirradiated areas are then dissolved away, leaving a pattern of oxide material. This oxide material is then converted to a high $T_c$ superconducting state, as by annealing in an oxygen atmosphere. This provides the patterned layer of high $T_c$ oxide superconductor. An example of a such a superconductor is a mixed copper oxide, such as $Y_1Ba_2Cu_3O_{7-x}$.

27 Claims, 1 Drawing Sheet

FABRICATION OF PATTERNED LINES OF HIGH $T_c$ SUPERCONDUCTORS

BACKGROUND OF THE INVENTION

1. Field of the Invention

This invention relates to processes for producing patterned high $T_c$ superconducting layers, and more particularly to techniques that enable the writing of any type of pattern of high $T_c$ superconducting materials where the pattern is produced prior to the formation of a high $T_c$ superconducting phase in the materials.

2. Description of the Related Art

High $T_c$ oxide superconductors are materials of the type first discovered by J. G. Bendnorz and K. A. Mueller and reported by them in Z. Phys. B, 64, 189 (1986). These are superconducting oxides typically including combinations of 1 or more rare earth elements, alkaline earth elements, copper and oxygen and in which the transition temperature is greater than 30K. Typical high $T_c$ superconducting oxides are those fabricated from compounds of La, Sr, Cu and O, or Y, Ba, Cu and O. One of these materials, the Y-Ba-C-O oxide superconductor, has exhibited critical transition temperatures in excess of 77K. A particularly preferred single phase composition of this material is $Y_1Ba_2Cu_3O_y$, which is often referred to as a "1-2-3" superconducting phase.

In the electronics industry, the fabrication of films of various thicknesses is important. In particular, the deposition of superconducting $YBa_2Cu_3O_{7-y}$ thin films has been obtained by various techniques, including sputtering, evaporation, and plasma spray coating. Related copending applications describing vapor transport and plasma spray coating of high $T_c$ superconducting oxides are Ser. No. 027,584, filed Mar. 18, 1987 and Ser. No. 043,523, filed Apr. 28, 1987, respectively. In addition, reference is made to the following technical journal articles which also describe the deposition of superconducting films.

1. R. B. Laibowitz et al, Phys. Rev. B, 35, 8821 (1987).
2. P. Chaudhari et al, Phys. Rev. Lett., 58, 2684 (1987).
3. J. J. Cuomo et al, submitted to the American Ceramics Bulletin.

In thin film technology, it is necessary to provide patterns of the films when devices, interconnections, and packages are to be fabricated. In the case of high $T_c$ oxide superconductors, it has become clear in the art that patterning of these materials is not trivial. Generally, the materials are ceramic copper materials having a perovskite-like structure that is not easily patterned. Wet photolithographic methods involve the use of various chemicals to which these ceramic materials are very sensitive, thus leading to alteration of their superconducting properties. Additionally, these materials tend to be porous and the use of chemicals will lead to etching of regions under an applied resist mask, thereby leading to poor resolution and undercutting.

Negative patterning of thin high $T_c$ superconducting films can be done by ion implantation as described by G. C. Clark et al, Appl. Phys. Lett. 51, 139 (1987). This technique utilizes ions to destroy the superconductivity in the irradiated regions when the ion implantation is above a threshold dose. A superconducting quantum interference device (SQUID) was fabricated in this way and has been described by R. H. Koch et al in Appl. Phys. Lett. 51, 200 (1987). Additionally, this device and its fabrication technique are described in copending application Ser. No. 037,912, filed April 13, 1987, and assigned to the present assignee. The ion implantation technique is, however, limited to very thin layers of up to about 1-2 micrometers and also involves a high vacuum that tends to deplete oxygen from the superconducting film. Therefore, an annealing step is required after ion implantation. This may lead to diffusion of the implanted ions which could affect superconductivity in the film.

Another approach to patterning high $T_c$ superconducting films is laser ablation using an appropriate mask either in contact with the film, or by projection imaging. This type of technique has been described by M. Scheuermann et al in an article submitted to Appl. Phys. Lett. In this technique, patterning is obtained by removing the unwanted areas of the film by direct ablation using an excimer laser providing ultraviolet wavelengths. This technique has limitations in that mask fabrication is required and the process itself produces debris which must in some way be removed.

In order to improve the patterning of layers of high $T_c$ superconductors, a discovery has been made which allows patterning to occur in a fabrication step prior to the achievement of a superconducting thin film. This inventive technique does not require the use of a mask and allows direct writing with an energy beam to accomplish patterning of any arbitrary geometry.

Accordingly, it is an object of this invention to provide an improved technique for producing patterns of high $T_c$ superconducting layers.

It is another object of this invention to provide a technique for patterning high $T_c$ superconducting layers which does not require that the layers be patterned after they are in a superconducting state.

It is another object of the present invention to provide a process that produces patterned high $T_c$ superconducting layers, where direct writing using an energy beam can be used to provide any desired pattern.

It is another object of the present invention to provide a technique for producing patterns of high $T_c$ superconducting layers, where the technique is not limited by the physical and chemical properties of the superconducting material.

SUMMARY OF THE INVENTION

This invention is a technique for providing patterned layers of high $T_c$ oxide superconductors. Rather than forming a layer of superconducting material and then patterning it, the present invention patterns a precursor layer before the layer is converted to a high $T_c$ superconducting state. This eliminates the disadvantages described hereinabove with respect to the difficulty of patterning these oxide superconductors.

In general, the steps of the process include the formation of a solution of the necessary constituents of the desired film in the proper proportions, the application of this solution to a substrate by a technique such as spraying, and the application of an energy beam (such as a laser beam) to selected areas of the layered material to convert the irradiated portions to an intermediate state such as an oxide state. This oxide state is nonsuperconducting, but differs in physical and chemical properties from the areas of the film which have not been irradiated by the energy beam. The next step is similar to a "development" step in that the nonirradiated portions are removed, as by dissolving them away in an appropriate solvent. The portions of the film which have been irradiated remain in this step. After this, the remaining oxide regions are made superconductive by annealing in an oxygen environment.

As an example, nitrates are prepared of the components that are to be present in the final superconducting film. These nitrates are mixed in the appropriate stoichiometric proportions and a solution of these nitrates is prepared. This solution is sprayed onto a substrate that is preferrably held at slightly elevated temperature. After the solvent has evaporated from the sprayed film, a laser beam can be used to thermally convert the irradiated portions of the sprayed film to an intermediate oxide state, leaving the nonirradiated portions in their nitrate state. After the laser writing is completed, the nonirradiated nitrate areas of the film are removed by dissolving them in a suitable alcohol solvent. The remaining patterned oxide film is then annealed at an appropriate temperature in an oxygen environment, and cooled to perfect the high $T_c$ superconducting state.

As will be apparent, any substrate can be used and the writing process can be accomplished by using an energy beam to either thermally or photochemically convert the irradiated regions to the desired oxide intermediate state. Additionally, the precursors can be other than nitrates, such as, for example, acetates. Any copper based high $T_c$ oxide superconductor can be provided as a patterned layer by this technique.

These and other objects, features, and advantages will be apparent from the following more particular description of the preferred embodiments.

DESCRIPTION OF THE PREFERRED EMBODIMENTS

The general procedure in this process is the provision of a solution containing the constituents that are to be in the final high $T_c$ superconductor layer in their appropriate proportions, applying the solution as by spraying or spinning onto a substrate on which the layer is to be formed, applying an energy beam at localized regions of the layer to convert those irradiated regions to an intermediate oxide state, removing the nonirradiated portions, and perfecting the high $T_c$ superconducting state in the remaining oxide portions of the layer. These steps will be explained in more detail with reference to FIGS. 1A-1D, and examples will be given to illustrate further details of the process.

Figure 1:
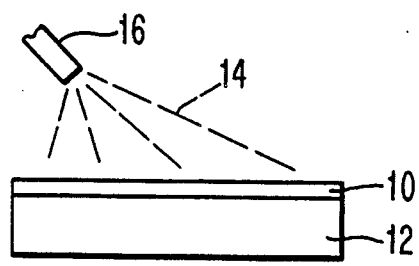
FIGS. 1-4 schematically illustrate representative steps of the inventive process for providing patterned layers of high $T_c$ superconducting materials.

In FIG. 1, a film 10 is coated onto a substrate 12, as by spraying using a fine air spray or an ultrasonic sprayer, the spray being indicated by the lines 14 of solution which emanate from the airbrush 16. Although different examples of the solution will be described in more detail later, a representative example for ultimately providing a $YBa_2Cu_3O_{7-x}$ superconducting film can be a stoichiometric aqueous solution of nitrate precursors of Y, Ba, and Cu in the ratio Y:Ba:Cu=1:2:3. This solution is sprayed onto the substrate 12, where the substrate is advantageously heated to a temperature of about 180°-200° C. The sprayed film-substrate combination is then mounted on a hotplate (180°-200° C.) on top of a horizontal x-y translation stage.

Figure 2:
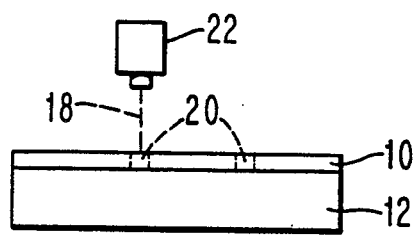

In FIG. 2, the beam writing step is illustrated in which an energy beam 18 irradiates selected regions 20 of the sprayed film 10. A representative energy beam is a laser beam at a wavelength of, for example, 514.5 nm produced by an $Ar^+$ ion laser 22. The laser beam has a typical energy of about 300 mW and is focussed onto the film 10 by the appropriate optics. The film-substrate combination is then scanned in the x-y plane to write the desired pattern. The energy beam converts the localized irradiated regions from nitrate-based compositions to an intermediate oxide-based composition. This oxide is nonsuperconducting in this state.

An energy beam of a wavelength in the ultraviolet range produced by an excimer laser or Ar ion, He-Cd laser, etc. will cause photochemical conversion of the nitrates to oxides, while a wavelength above 400 nm will cause conversion of the nitrates to the oxides by a thermal process. Absorption of the wavelength 514.5 nm in the sprayed nitrate film is quite weak. However, this does not pose a serious problem since, once the black oxide material is formed, it will have strong absorption of the visible laser light to enable the continuation of a rapid writing process at a speed of about 1 cm/s. In the case of an excimer wavelength in the ultraviolet range, such wavelengths will be strongly absorbed by the nitrates in the sprayed film, and can be used for rapid conversion to oxides.

If the substrate is held at a slightly elevated temperature, such as 180°-200° C., adhesion to the substrate is enhanced. Also, an elevated substrate temperature will allow for immediate vaporization of the solution solvent once the spray mist hits it. Still further, if the substrate is kept at an elevated temperature during the writing process, the beam energy required for decomposition of the nitrates and conversion to an intermediate oxide state will be reduced. However, the process will work at room temperature. In the case of a nitrate film, temperatures in excess of 200° C. are apt to cause a blanket conversion of the entire sprayed film to the intermediate oxide state, which will render impossible the patterning technique of this invention.

Figure 3:
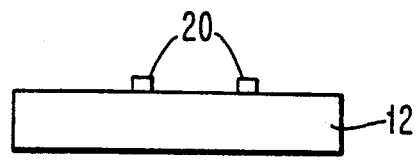

FIG. 3 illustrates the development step in which the unirradiated regions of the sprayed film are removed by dissolving them in an alcohol solution, such as ethanol or methanol, using an ultrasonic cleaner. This leaves the intermediate oxide regions 20. Generally, water is not used for this developing step since, besides removing the unirradiated nitrates effectively, it also tends to remove BaO from the irradiated regions, thereby affecting the stoichiometry which will be needed to provide a superconducting film. After irradiation and development, the regions 20 are highly insulating, rather than being conducting.

Figure 4:
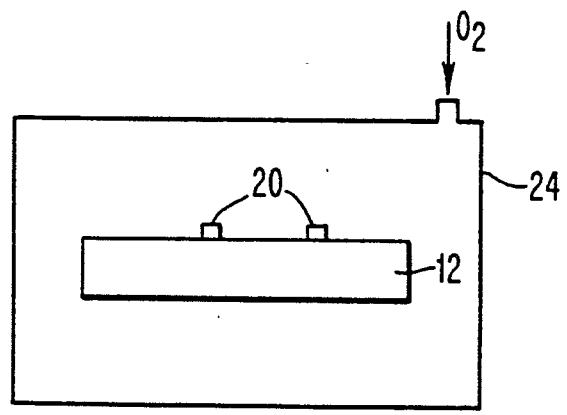

In FIG. 4, the patterned film-substrate combination is placed in a hot oven 24 (925°-950° C.) under flowing helium (about 1 liter/min.). The He flow is then replaced by an oxygen flow (about 1 liter/min) and the oven is then shut off. Cooling is continued over a period of 2-3 hours down to about 200° C. and the sample is removed from the oven. In this state, the required stoichiometry for high $T_c$ superconductivity has been established and a pattern 20 of superconducting lines is then present on the substrate 12.

In this process, a film of the precursors was utilized to selectively change properties in the film so that a differential "development" step could be undertaken. After this, the remaining portions of the film were converted to a superconducting state. Thus, patterning is accomplished prior to the achievement of the superconducting state, in order to eliminate the difficulties encountered in trying to pattern superconductive materials of this type. Further, large area coatings can be achieved quickly and with minimal cost. These coatings can be provided over a wide thickness range, and the ultimate resolution of the patterned lines is dependent on the spot size of the irradiated region. The current carrying capability of the patterned lines will depend on the particular annealing steps that are used and on the presence of impurities purposely put into the solution for incorporation as pinning sites for magnetic flux vortices in these materials. Also, if the films are epitaxially grown on the substrate with the c-axis perpendicular to the substrate surface, higher critical current densities will be achieved.

Any type of substrate can be used although, for $YBa_2Cu_3O_{7-x}$ superconducting films, the most suitable substrate appears to be yttria stabilized zirconia. Other substrates include, for example, $SrTiO_3$, MgO, sapphire, etc.

While a laser beam is preferrable for the energy beam 18, electron beams or ion beams can also be used. For laser wavelengths in the ultraviolet range, conversion to intermediate state oxides may occur by a photochemical effect, while for other wavelengths a thermal effect is utilized. The decomposed film could be a mixed oxide or an intermediate phase.

The technique of this invention can be used to provide patterned films of all copper oxide based high $T_c$ superconductors. The precursor solution, while illustrated as a nitrate solution, can be a different type of solution, including an acetate, an acetylacetonate solution, or an alkoxide solution, etc. The nitrate precursor solution is advantageous in providing good control on the ratio of the elements that are to be in the superconductor film. Other examples are alkoxides and/or soaps (e.g., neodecanoate, napthenate, etc.) of these compounds which decompose at relatively low temperatures. By choosing the precursors carefully, the decomposition and anneal temperatures can be reduced significantly to allow the use of heat sensitive substrates.

As noted, several different types of lasers can be used including $CO_2$, Ar ion lasers, and He-Cd lasers. Both continuous wave and pulsed lasers can be used. Typically, at 514 nm a few hundred mW of power is used to provide about $1-5 \times 10^5$ W/cm$^2$. If the laser power is too high the Ba stoichiometry in the converted oxide film is destroyed, making it difficult to achieve the superconducting state in films of YBaCu oxide. These upper limits will be varied by a small amount for other types of copper oxide superconducting films, such as the La-Ba-Cu-O and La-Sr-Cu-O compositions.

It is preferable to initially use an solution, rather than a slurry (which is not as controllable) to provide a uniform thickness film. Further, a slurry may not be soluble and therefore not easily developed.

The following examples will illustrate the application of this process to the fabrication of patterned high $T_c$ superconducting films.

EXAMPLE I

In this example, a simple spray deposition technique is used to deposit a precursor film on a substrate. The ultimate goal is the preparation of patterned high $T_c$ superconducting thin films of $YBa_2Cu_3O_{7-x}$ on (100) single crystal MgO, $ZrO_2$ with 9% $Y_2O_3$ (yttria stabilized zirconia or YSZ) and $SrTiO_3$.

In a first step, a mixed nitrate powder of Y, Ba, Cu is prepared by mixing stoichiometric amounts of $Y_2O_3$, $BaCO_3$ and CuO in the ratio Y:Ba:Cu=1:2:3 with nitric acid and then evaporating to dryness to remove any excess acid. This procedure, rather than starting from the nitrate precursors directly, avoids uncertainties in the stoichiometry due to the unknown water content of the nitrates. A dilute solution of 1-2 Wt. % of the mixed nitrates is then prepared by additional water. This solution is sprayed onto the substrate of choice using a fine airbrush with nitrogen as the carrier gas. The substrate is kept at an elevated temperature of 180°-250° C. to allow for immediate evaporation of the solvent once the spray mist hits the substrate. An addition of up to 25% ethanol to the solution allows deposition at lower temperatures. The as-deposited nitrate films in this example were typically 6-8 micrometers thick.

X-ray diffraction patterns of the as-deposited film show major peaks attributable to barium nitrate, $Ba(NO_3)_2$, and basic copper nitrate, $Cu_2(OH)_3NO_3$. Although diffraction peaks of yttrium nitrate were not observed, this material was probably present as an amorphous phase. The basic copper nitrate is formed due to partial decomposition of the nitrate while being sprayed on the heated substrate.

The nitrates were decomposed into oxides by the application of laser wavelengths at 514.5 nm. This writing step occurred while the film-substrate combination was held at 180°-200° C. The laser beam spot size was about 5-10 microns and the power was typically 300 mW. The film was scanned in the x-y plane to write the desired pattern using this energy beam.

After writing the desired pattern, the nonirradiated nitrate areas were removed by dissolving them in an alcohol solution, such as ethanol or methanol using an ultrasonic cleaner. Suitable solvents for this purpose include chained and branched alcohols of the types mentioned, as well as others such as isopropanol. As noted, water could not be used for the development step.

The oxide lines which were left on the substrates were tested and found to be highly insulating, rather than superconducting. The patterned oxide film was then placed in a hot oven at 925°-950° C. under flowing helium for 5-20 minutes, after which the helium flow was replaced by a one liter/minute oxygen flow and the oven was shut off. Exposure to oxygen in a heated environment was for about 1 minute. Cooling then continued for a period of 2-3 hours down to about 200° C. when the samples were removed from the oven and tested for superconductivity.

For lines written on MgO, superconducting oxides were produced having onset temperatures of about 82K. The completion, or the zero resistivity state occurred at a higher temperature for the blanket film than for the laser-written superconducting line. This is probably due to a higher reaction of the laser-written line with the substrate during irradiation and the possible removal of one or more of the components of the laser-written line in the development process. Another reason could be the use of annealing conditions which were not optimized. It was found that the Yttria stabilized zirconia substrates tended to provide films having higher temperature zero resistance states. For example, zero resistance states at 87K were measured for superconducting films formed on YSZ substrates. Other lines written on YSZ substrates showed an onset temperature of 92K and a completion of the superconducting transition at 85K.

EXAMPLE II

In this example, the various substrates are those described with respect to example 1. Patterns of $YBa_2Cu_3O_{7-x}$ superconducting films were formed using acetates as precursor solutions. Stoichiometric amounts of the powders of $Y_2O_3$, $BaCO_3$ and $CuO$ were mixed with acetic acid and then evaporated to dryness to remove any excess acid. A dilute solution of 1-2 Wt. % of the mixed acetates was then prepared by the addition of water or a water/ethanol mixture. This solution was sprayed onto the substrates (MgO, $SrTiO_3$, YSZ, sapphire), and the remaining steps were those described with respect to example 1.

It may be possible to vary the precursor solution somewhat to provide a sprayed film which can be directly converted by the energy beam into oxides of the appropriate stoichiometry to exhibit a superconducting state without the normally required annealing step. The provision of an oxygen environment during the beam writing step may provide sufficient amounts of oxygen in the irradiated regions that those regions will be superconducting after the irradiation step. This would allow one to accomplish patterning by development after energy beam writing, and would therefore be a low temperature process to achieve a patterned $T_c$ superconducting oxide layer. By eliminating the high temperature anneal, the fabrication of the patterned superconductor layer is more compatible with other processes in which lower preparation temperatures are desired.

In the practice of this invention, a film or layer is provided which is irradiated by an energy beam to create regions in the layer which are chemically and physically different than the unirradiated regions, thereby allowing a removal step that differentiates between the two regions in order to leave material which can be converted to a high $T_c$ superconducting state. In the course of this invention, the use of a technique such as spraying is preferable because of its ease of accomplishment and low cost, but it should be understood that other techniques can be utilized to produce the initial precursor film layer.

While the invention has been described with respect to particular embodiments thereof, it will be apparent to those of skill in the art that variations can be made therein without departing from the spirit and scope of the present invention. Thus, the invention is directed to the provision of patterned films or layers of varying thickness of high $T_c$ oxide superconductors, and particularly those which are copper oxide based superconductors.

Having thus described our invention what we claim as new and desire to secure as Letters Patent, is:

1. A method for providing a patterned layer of high $T_c$ oxide superconductor material, comprising:
    preparing a solution containing the components of said oxide superconductor in the proper stoichiometric ratios,
    coating said solution onto a substrate to provide a coated layer thereon,
    irradiating selected areas of said coated layer with an energy beam to convert said irradiated areas to an intermediate, nonsuperconducting oxide state, said energy beam being chosen to maintain said proper stoichiometric ratio during conversion to an oxide state,
    removing the nonirradiated areas of said coated layer to leave a patterned layer of said nonsuperconducting oxide, and
    converting said patterned layer to a high $T_c$ superconducting state, thereby producing a patterned layer of high $T_c$ oxide superconductor.

2. The method of claim 1, where said nonsuperconductive oxide is converted to a high $T_c$ superconducting state by annealing in an oxygen atmosphere.

3. The method of claim 1, where said solution is coated on said substrate by spraying it thereon.

4. The method of claim 1, where said patterned high $T_c$ oxide layer is epitaxial.

5. The method of claim 1, where said energy beam is a laser beam.

6. The method of claim 5, where said laser beam provides ultraviolet wavelengths.

7. The method of claim 5, where said laser beam provides visible wavelengths.

8. The method of claim 1, where said energy beam is scanned across said coated layer.

9. The method of claim 1, where said high $T_c$ oxide superconductor is a mixed copper oxide.

10. The method of claim 1, where said substrate is heated during said irradiation step.

11. The method of claim 1, where said removing step is accomplished by dissolving said nonirradiated areas.

12. A method for providing a patterned layer of high $T_c$ oxide superconductor material, comprising:
    coating a substrate with a solution containing the components desired in said high $T_c$ oxide superconductor, said components being in solution in the proper ratios, and drying to provide a layer on said substrate,
    locally converting selected areas of said layer to an oxide state while maintaining the cation components of said layer in the proper stoichiometric ratio,
    removing nonselected areas of said layer to leave a patterned layer of oxide material, and
    producing a high $T_c$ superconducting state in said patterned layer of oxide material.

13. The method of claim 12, where said high $T_c$ superconducting state is $YBa_2Cu_3O_{7-x}$.

14. The method of claim 12, where said high $T_c$ superconducting oxide state is a mixed oxide of copper.

15. A method for providing a patterned layer of oxide material that is a precursor to a high $T_c$ oxide superconductor, comprising the following steps:
    preparing a solution containing the cation components of said high $T_c$ oxide superconductor, said cation components being in said solution in the proper stoichiometric amounts required in said high $T_c$ oxide superconductor,
    coating said solution onto a substrate to produce a coated layer thereon,
    irradiating selected areas of said coated layer with an energy beam to create regions having chemical properties different than those of the surrounding nonirradiated regions, said irradiated regions being comprised of an oxide precursor to said high $T_c$ oxide material, said energy beam having an energy less than that which would change said proper stoichiometric amounts of said cation components, and
    dissolving said nonirradiated regions to remove them from said layer, thereby leaving a patterned layer of oxide material which is a precursor to said high $T_c$ oxide superconductor.

16. The method of claim 15, including the additional step of converting said patterned oxide precursor layer to a high $T_c$ superconducting state.

17. The method of claim 16, where said high $T_c$ oxide superconductor is a mixed copper oxide.

18. The method of claim 17, where said energy beam is a laser beam.

19. The method of claim 15, where said solution is a nitrate solution.

20. A method for providing a patterned layer of high $T_c$ copper oxide superconductor, comprising:

preparing a solution containing the components of said high $T_c$ oxide superconductor, said components being present in said solution in the amounts required in said high $T_c$ copper oxide superconductor, spraying said solution onto a substrate to provide a coated layer thereon, irradiating selected areas of said coated layer with an energy beam to convert said irradiated areas to an intermediate oxide state, the energy and scanning rate of said energy beam being chosen to maintain the relative amounts of the cation components in said layer, dissolving the nonirradiated areas of said coated layer to remove them, leaving a patterned layer of oxide material, and annealing said patterned layer of oxide material in an oxygen atmosphere to produce a high $T_c$ superconductivity state, said oxide material being a copper oxide.

21. The method of claim 20, where said substrate is heated during said spraying step and said irradiation step.

22. The method of claim 21, where said energy beam is a laser beam.

23. The method of claim 22, where said oxide superconductor is a Y-Ba-Cu-O oxide material.

24. The method of claim 22, where said patterned high $T_c$ copper oxide superconductor is an epitaxial layer.

25. A method for providing a patterned layer of high $T_c$ copper oxide superconductor material, comprising:

coating a substrate with a solution containing the components desired in said high $T_c$ copper oxide superconductor, said components being in solution in the proper ratios, to provide a layer on said substrate, locally converting selected areas of said layer to an oxide state exhibiting high $T_c$ superconductivity by irradiating said selected areas with an energy beam whose energy fluence is less than that which would alter said proper ratios, and removing nonselected areas of said layer to leave a patterned layer of high $T_c$ superconducting copper oxide material.

26. The method of claim 25, where said removing step is achieved by dissolving away said nonselected areas.

27. The method of claim 26, where said superconducting copper oxide layer is an epitaxial layer.

* * * * *